United States Patent [19]

Ting et al.

[11] Patent Number: 4,885,262
[45] Date of Patent: Dec. 5, 1989

[54] CHEMICAL MODIFICATION OF SPIN-ON GLASS FOR IMPROVED PERFORMANCE IN IC FABRICATION

[75] Inventors: Chiu H. Ting, Saratoga; Thomas G. Rucker, Palo Alto, both of Calif.; Zbigniew P. Sobczak, Andover, N.J.

[73] Assignee: Intel Corporation, Santa Clara, Calif.

[21] Appl. No.: 320,763

[22] Filed: Mar. 8, 1989

[51] Int. Cl.$^4$ .......................................... H01L 21/265
[52] U.S. Cl. ..................... 437/231; 437/228; 437/240; 437/248; 437/982
[58] Field of Search ............... 437/231, 228, 238, 229, 437/240, 982, 248

[56] References Cited

U.S. PATENT DOCUMENTS

| | | | |
|---|---|---|---|
| 4,753,866 | 6/1988 | Welch | 430/314 |
| 4,780,394 | 10/1988 | Blanchard | 430/316 |
| 4,818,335 | 4/1989 | Karneft | 437/240 |
| 4,824,767 | 4/1989 | Chambers | 437/229 |

Primary Examiner—Brian E. Hearn
Assistant Examiner—Kevin McAndrews
Attorney, Agent, or Firm—Blakely, Sokoloff, Taylor & Zafman

[57] ABSTRACT

A process for chemically modifying spin-on-glass (SOG) for improved performance in semiconductor device fabrication is disclosed. To compensate for severe surface topographies associated with very large scale integration (VLSI) technology, a thicker non-etch back SOG process is utilized for forming a SOG layer over a chemical vapor deposition (CVD) layer. A single layer of SOG is formed over the CVD layer, providing planarizing coverage over formational or growth defects. The silylation of the SOG layer provides for the formation thicker single layers of SOG and significantly reduces the wet etching rate in diluted HF.

10 Claims, 4 Drawing Sheets

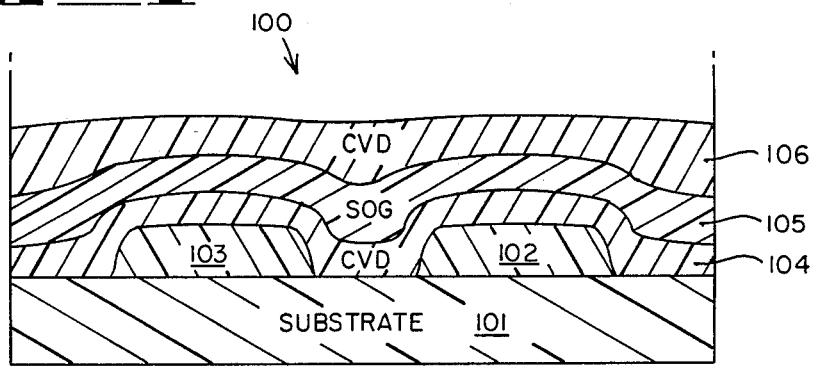
FIG_1
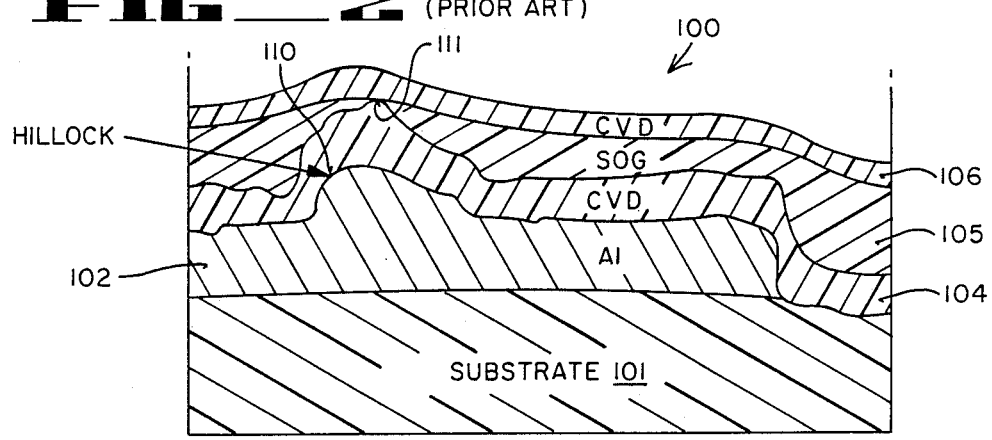
FIG_2 (PRIOR ART)
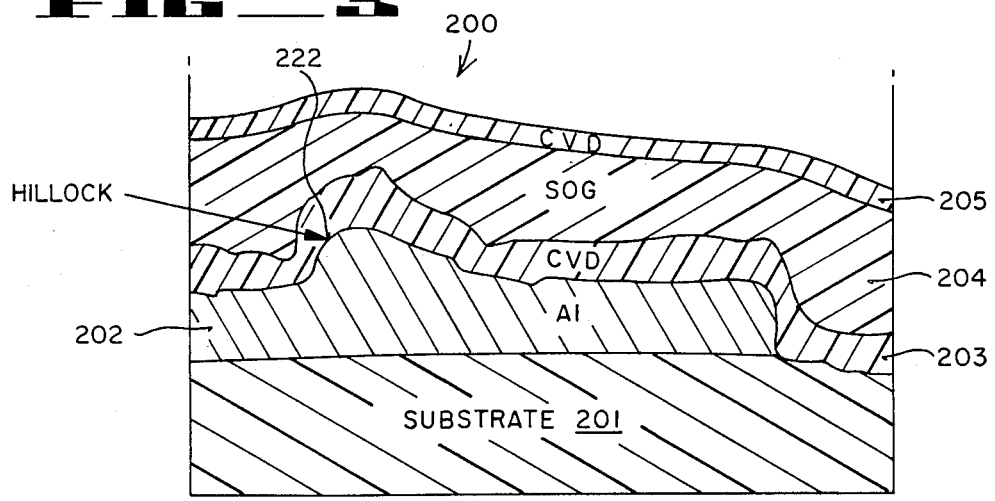
FIG_3

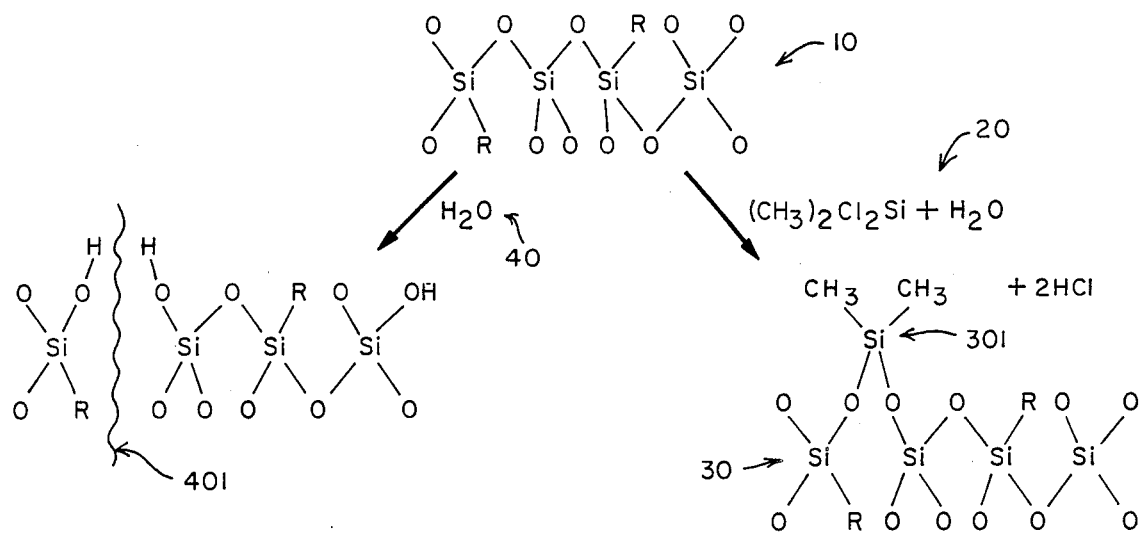
FIG_4
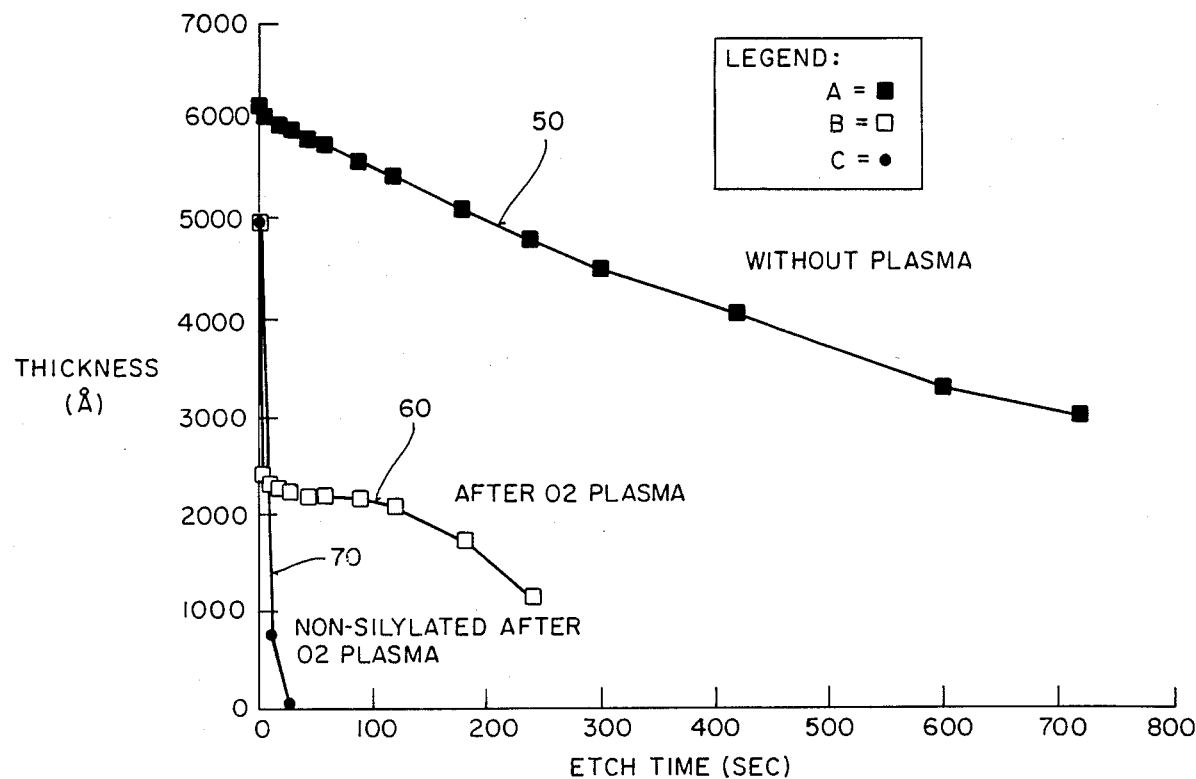
FIG_5

FIG_6A
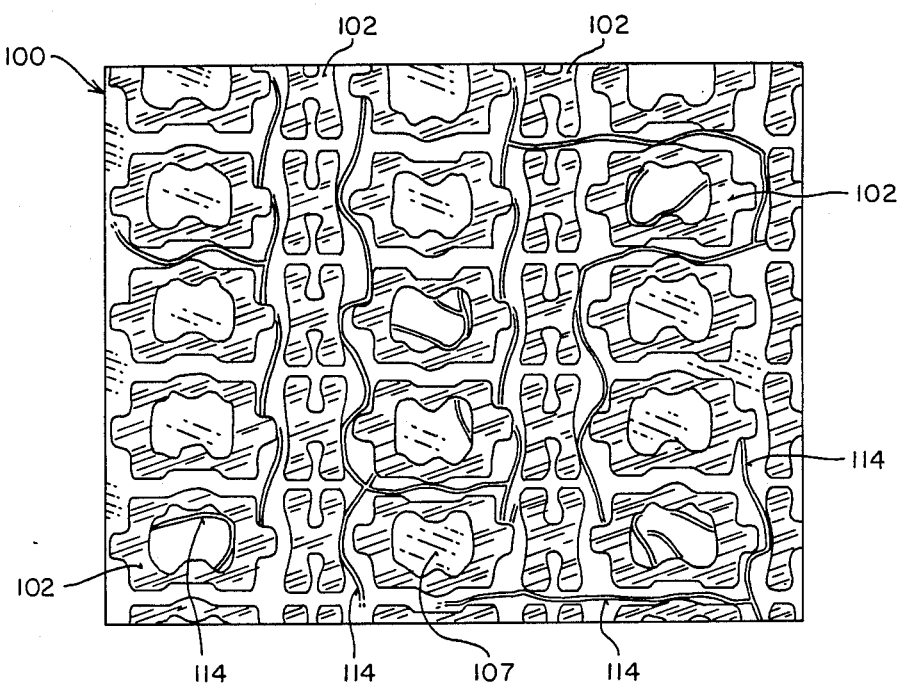
FIG_6B
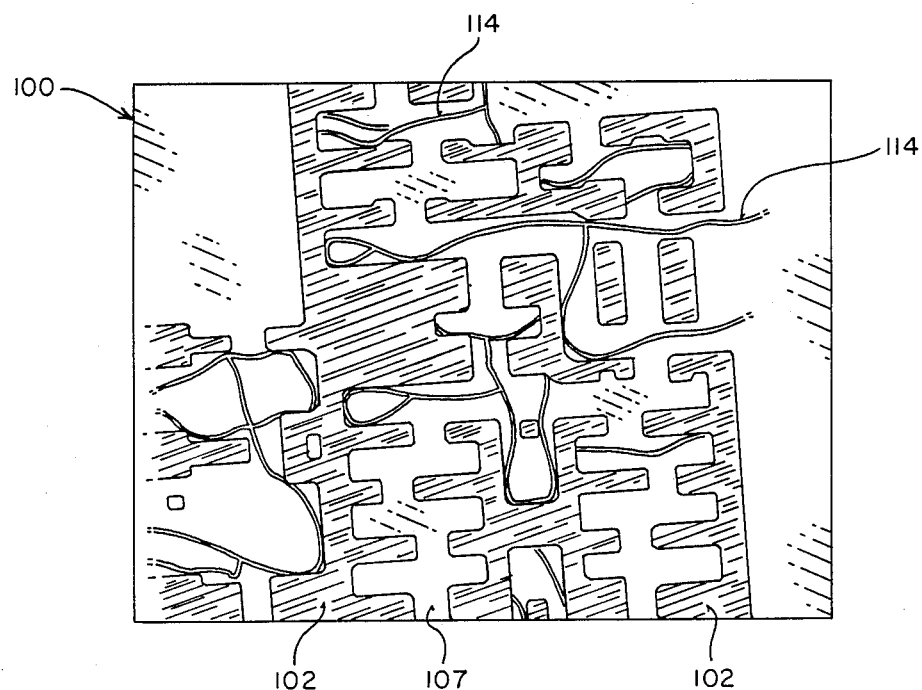

FIG_7A
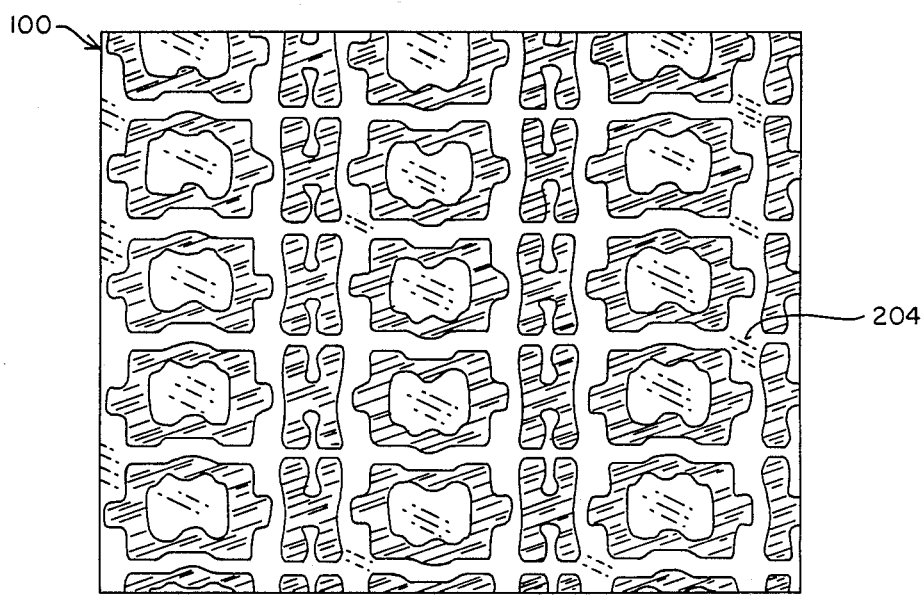
FIG_7B
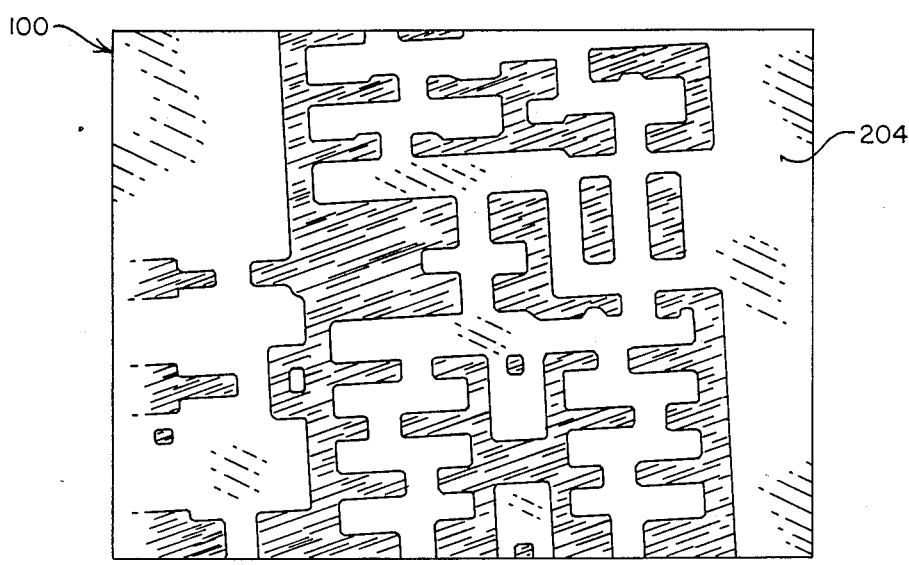

CHEMICAL MODIFICATION OF SPIN-ON GLASS FOR IMPROVED PERFORMANCE IN IC FABRICATION

BACKGROUND OF THE INVENTION

1. Field of the Invention

This invention relates to a spin-on-glass (SOG) process for improved material properties and performance for very large scale integration (VLSI) interlayer dielectrics by providing for a chemical modification of the SOG materials.

2. Prior Art

As the scale of integration increases and device dimensions decrease, the performance of VLSI chips are limited by interconnection capabilities. For example, VSLI technology for 1-micrometer processes requires a greater control on the materials and techniques that are well beyond that of only slightly larger 2-micrometer processes. While the dimension is scaled in half, the degree of difficulty can increase in the range of 5 to 10 times. Furthermore, as the number of layers of interconnection increases, even more stringent requirements are placed on the interlayer dielectric separating the metal layers.

Multi-layer metallization is required to provide improved interconnection capabilities for increased circuit speed, circuit density, as well as design flexibility for customized applications. However, the surface topography generated by multi-layer processes causes serious difficulties for subsequent processing steps such as lithography, deposition and etching. It also degrades device reliability by causing poor step coverage, metal migration, and stress induced cracking. Therefore, surface planarization is essential for continual progress in integration.

Historically, the interlayer dielectric has been a chemical vapor deposition (CVD) oxide that has produced a less than conformal coating. With decreased metal spacing, this deposition method produces undesirable voids between the tight metal line. The severe topography induced by multi-layer interconnects and conformal coatings increases the difficulties in metal deposition. However, many different approaches have been studied and used to give a more planar dielectric layer, such as, glass flow and reflow, bias sputter quartz, lift-off, etch-back processes and spin-on-dielectric.

Among the several dielectric planarization schemes available, spin-on glass (SOG) offers the greater potential and flexibility as a planarizing medium for the intermetal dielectric. SOG is a smoothing dielectric applied by spin coating that fills the spaces in the smaller geometries. The general composition of SOG materials range from silicates (Si-O) framework to polysiloxanes which contain varying concentrations of methyl and phenyl groups.

Silicates, either undoped or doped, generally solidifies to a rigid film at a rather low temperature and cracks easily for thicker coatings, particularly over surface topography. The polysiloxane materials, with various attach organic groups, were developed to improve the coating characteristics as well as to prevent crack formation for thicker coatings. However, the thickness of polysiloxane films is still limited to approximately 4000 Angstroms (Å).

There are two general process flows employed when SOG is incorporated: etch-back and non-etch-back. For example, U.S. Pat. No. 4,775,550, Chu et al. discloses an etch-back process. In the etch-back process there are less stringent demands placed on the material properties of the SOG since it is surrounded by CVD oxide and does not come in contact with the device. Additional examples of the etch-back process may be found in Prior Art References 2 and 6.

On the other hand, in the non-etch-back process, the SOG is in contact with the device and the material characteristics are extremely important. Several methods of integrating the non-etch-back SOG into the process have been proposed, such as SOG as a stand-alone intermetal dielectric, a CVD dielectric either on top or beneath the SOG to form a dual-film intermetal dielectric, and a sandwich scheme with SOG encapsulated between two layers of CVD dielectric. The simplest technique of SOG planarization would be to use a stand alone SOG film as the intermetal dielectric. However, the current SOG materials cannot spin on 1 micrometer (10,000 Å) thick films and still maintain their crack resistance and dielectric characteristics. As such, the stand alone method is generally considered as an unavailable choice. Increasing the total layer thickness by multiple coats is not effective since extensive cracking is still observed when multiple coatings of SOG are applied.

On the other hand, when thin layers of SOG, in the range of 1000 to 3000 Å, are used, a CVD dielectric is needed to form the isolation between the metal layers. As a result of several problems, such as adhesion loss and degradation of film stability, a sandwich scheme with a layer of SOG encapsulated between two layers of CVD dielectric is effective in obtaining planarization without the problems exhibited by a single layer of CVD and a single layer of SOG. A dielectric is the first layer and serves as an adhesion and hillock suppressor layer and should prevent the SOG from coming in contact with the metal. SOG is the second layer and serves primarily as the planarization layer. Finally a CVD dielectric is the third layer and serves as an isolation layer. For a more detailed description of the prior art sandwich processes see Prior Art References 4 and 5.

Theoretically, the SOG layer should transform the severe topography of the device into a smooth one thus allowing the third layer to have a good step coverage and good isolation. However, the SOG materials generally used have problems associated with it. The thickness at which the SOG materials crack is dependent on the chemical composition. In general, the silicate material will exhibit cracking when coating thicknesses exceed 1000 Å, whereas the polysiloxanes are more crack resistant and can be coated to approximately 3000 to 4000 Å. However, SOG films exceeding thickness of 3000–4000 Å over severe surface topography exhibit extensive and severe cracking.

As a result of the a thick film's tendency to crack, the planarity of a single thin SOG spin application is generally not adequate, therefore at least two or more coats applied in sequence are necessary to obtain satisfactory planarity. For an example of multi-layer processes see Prior Art Reference 3. Although there is a need to be able to coat the devices with film thicknesses of 4000 to 7000 Å, the desired film thickness by using multiple layers of thin coats can not be obtained above approximately 4500 Å without an extensive and severe cracking problem. Additionally, the application of multiple layers decreases the ease of production, therefore correspondingly increases production costs.

Another problem typically associated with SOG materials is their susceptibility to dilute HF etching baths and to oxygen plasma. Deposited silicon and aluminum layers are very readily oxidized and a "native oxide" is created on the surface. Before proceeding with the next step in the process, the native oxide must be removed to obtain a clean surface. The native oxide is typically removed by dipping the wafer in an etching bath. However, the SOG material is strenuously attacked by the etching bath, resulting in a severe loss of the SOG layer. Additionally, problems arise with the metal deposition in the vias of the device.

Another disadvantage of the SOG material is their sensitivity to oxygen plasma. Generally, the oxygen plasma reacts with the organic groups of the film replacing them with hydroxyl groups (—OH). This reduces the etch resistance and inhibits the ability to dip the devices in etching solution. Generally, the limitation of the SOG material is solved by changing the process flow to avoid these sensitivity problems.

The SOG layer may also be used to reduce the surface topography before the deposition of the final passivation layer. For example, the final passivation layer for a 1.5 μm CMOS process consisted of a one micrometer thick oxynitride layer capped with a two micrometer thick phosphorus doped glass layer. The process using a passivation layer proved to be adequate until the device dimensions were reduced to one micrometer or less. Because of the severe topography of the scaled down devices, the CVD oxynitride layer tended to develop defects or microcracks in the narrow spacing due to severe shadowing and stress effects. Theoretically, the problems can be reduced or eliminated when an SOG layer is used to reduce the surface topography. With a thin layer of SOG, 2000 Å, the topography is still quite severe. Although, a 4000 Å layer appears to be adequate, the problems associated with the thicker SOG layers are now prevalent and prohibit the use of 7000 Å, which would be a most desirable thickness.

PRIOR ART REFERENCES

1. Chu et al., U.S. Pat. No. 4,775,550
2. M. Kawai et al., *Interlayered Dielectric Planarization with TEOS-CVD and SOG*, V-MIC Conference, CH-2624-5/88/0000-0419, pp 419–25, 1988.
3. H. Kojima et al., *Planarization Process Using a Multi-Coating of Spin-On-Glass*, V-MIC Conference, CH-2624-5/88/0000-0390, pp. 390–96, 1988.
4. Ser. No. Chen et al., *Spin-On Glasses: Characterization and Application*, V-MIC Conference, CH-2624-5/88/0000-0306, pp 306–12, 1988.
5. D. L. W. Yen et al., *Process Integration with Spin-On-Glass Sandwich as an Intermetal Dielectric Layer for 1.2 μm CMOS DLM Process*, V-MIC Conference, CH-2624-5/88/0000-0085, pp 85–94, 1988.
6. C. H. Ting et al., *Planarization Process Using Spin-On-Glass*, V-MIC Conference, CH-2488-5/87/0000-0061, pp 61–77, 1988.

SUMMARY OF THE INVENTION

The present invention describes a process for chemically modifying a spin-on-glass for improved performance in a semiconductor device. A metal layer is first deposited on the semiconductor body and the openings are formed between patterned sections of the first metal layer. Next an oxide layer is deposited using a chemical vapor deposition technique. Then a spin-on-glass (SOG) layer is deposited having a thickness of approximately 3000–8000 Å on the first oxide layer. After the SOG layer is deposited, the layer is annealed at an annealing temperature of approximately 350°–450° C. in an oxygen ambient. Then the semiconductor device is cooled from the annealing temperature to room temperature in a nitrogen flow bubbled through an organosilicon compound that is heated to a temperature of approximately 50° C.

BRIEF DESCRIPTION OF THE DRAWINGS

FIG. 1 is a cross-sectional elevation view of a semiconductor body showing a multiple layer device.

FIG. 2 is a cross-sectional elevation view of a conductive semiconductor body showing a hillock deformation in the aluminum layer, a prior art spin-on-glass layer and the problem resulting from an insufficient layer of spin-on-glass.

FIG. 3 is a cross-sectional elevation view of the conductive semiconductor body of FIG. 2 showing the same hillock deformation and the spin-on-glass layer produced by the present invention.

FIG. 4 is a theoretical schematic of silylated and non-silylated spin-on-glass.

FIG. 5 is a chart showing the etch rate of silylated spin-on-glass under various conditions, varying thickness of the layer in Å versus the etch time in seconds.

FIG. 6a–b are representations of a photomicrograph of the top views of a patterned semiconductor body after adding a spin-on-glass layer showing a cracked landscape resulting from the thickness of the layer.

FIGS. 7a–b are representations of a photomicrograph of the top views of a patterned semiconductor body after adding a spin-on-glass layer approximately 8000 Å thick and illustrating an essentially crack-free landscape.

DETAILED DESCRIPTION OF THE PRESENT INVENTION

An invention is described that provides for a new non-etch back SOG process that inhibits defects in the glass layer. As a result of the chemical modification by silylating the SOG materials, formation of a thicker non-etch back SOG layer is obtained giving the performance necessary for micrometer and submicrometer technology. Advantageously, the chemical modification permits a thicker layer of SOG to be deposited without extensive and severe cracking. The elimination of the cracking improves the performance and yield of semiconductor device fabrication. Furthermore, silylation of the SOG significantly reduces the wet etching rate of SOG in diluted hydrogen fluoride (HF). In the following description, numerous specific details are set forth such as specific thicknesses, or specific flow rates in order to provide a thorough understanding of the present invention. It will be obvious, however, to one skilled in the art that the present invention may be practiced without these specific details. In other instances, well-known processes have not been described in detail in order not to unnecessarily obscure the present invention.

PRIOR ART

FIG. 1 illustrates a typical prior art semiconductor device 100 having several pattern regions 102–103. Pattern regions 102–103 are typically a polysilicon region or metal conductive region. A dielectric layer 104 such as a chemical vapor deposition (CVD) layer, is then formed above the substrate 101 and regions 102-103. The CVD layer 104 tends to follow the contours, or topography, of the lower layer. Then an insulating layer 105 such as a spin-on-glass (SOG) layer, is formed over the CVD layer 104. The SOG layer 105 acts as an insulator and helps to planarize the topography of the lower layers. After the SOG layer 105 is formed, an additional dielectric layer 106 is deposited over the SOG layer 105.

A problem encountered in the prior art technique of applying the SOG layer 105 resides in the formation of growth defects, such as hillocks, in the underlying layers. Referring to FIG. 2, a layer of aluminum is deposited on a substrate 101 and etching to form a conductive region 102. During deposition, a hillock 110 is formed. Next, a CVD layer 104 is formed over the conductive region 102 and the substrate 101. The CVD layer 104 not only mirrors the hillock 110 but appears to enhance the defect. Then a SOG layer 105 is formed. Although the SOG layer 105 generally planarizes the topography as a result of the lower layers, it is unable to cover the apex 111 of the hillock 110. Once the SOG layer 105 is applied, it is annealed at approximately 350°-450° C. in an ambient of nitrogen ($N_2$) or oxygen ($O_2$). Thus, when a second CVD layer 106 is deposited, the apex 111 of the hillock 110 is not be separated by the insulating SOG layer 105 and is directly in contact with the first CVD layer 104. Such an occurrence results in reduced performance and yield.

The problem of covering the hillock 110 with SOG layer 105, has been addressed by the prior art. However, the solution of the prior art is to use multiple layers of SOG to cover the hillock 110. Due to the physical characteristics of a conventional SOG, cracking occurs if the SOG layer is too thick. It is during the cooling step from the annealing temperature to room temperature that causes the thicker films to crack. Furthermore, additional thin layers of SOG display the same tendency to crack as if the SOG layer had been applied in a single thick layer, this is due to the additive effect of a number of this layers.

PRESENT INVENTION

FIGS. 3-7 illustrate the process of the present invention for overcoming the problems encountered in the prior art. The present invention allows for varying thicknesses of conductive layers and the severe topographies of high density devices. The present invention has been demonstrated to with conductor thickness of more than 1 micrometer and trench spacings of less than 1 micrometer ($\mu$m) between conductor segments. A single planarizing layer of SOG intermetal dielectric of more than 7000 Å has been achieved effectively by the silylation of the SOG layer.

Referring to FIG. 3, a conductive region 202 is formed on substrate 201 of a semiconductor device 200. A CVD layer 203 is formed over the conductive region 202 and the substrate 201. As in the prior art, a growth defect, such as a hillock 220 is present in the conductive region 202. As in the prior art, the CVD layer 203 mirrors the hillock 220. Subsequently, a SOG layer 204 is formed over the CVD layer 203. However, unlike the prior art techniques, the SOG layer 204 is thick enough to provide adequate coverage over the hillock 220. The ability to provide thicker coverage with the SOG layer 204, allows for less attention to the underlying topography. Up to the point prior to formation of the SOG layer 204, well-known prior art processes may be used to provide foundation layers below the SOG layer 205 and the structure is not limited to the description of the drawing.

It is appreciated that the subsequent steps provide an improvement over the prior art. Referring to FIG. 4, a SOG material 10 is illustrated. Although, the material 10 as drawn is depicted for illustration purposes, any functionally equivalent SOG material is suitable. It is theorized that the silylation of the SOG material 10 involves the addition of a —Si(CH$_3$)$_2$ group 301, usually by the displacement of a hydrogen (—H) from a hydroxy (—OH), amino (—NH$_2$), or mercapto (—SH) group. Silylation is accomplished using various organosilicon compounds at various stages of the SOG processing. Among the organosilicon compounds used are hexamethyldisilazane (HMDS), dimethyldichlorosilane (DMDCS), trimethylchlorsilane (TMCS), dimethyldimethoxysilane (DMDMOS), and bis(dimethylamino)-dimethylsilane (BDMADMS). However, any functionally equivalent organoslicon compound would be within the scope and spirit of the present invention.

Referring to FIG. 4, for example, when (CH$_3$)$_2$Cl$_2$Si (DMDCS) 20 is hydrated with water (H$_2$O) and mixed with the SOG material 10, a silylated SOG material 30 and hydrogen chloride (HCl) is formed. FIG. 4 illustrates a possible configuration of the resultant silylated SOG material 30, with the addition of the —Si(CH$_3$)$_2$ group 301, applied as a bridge in the sequence.

Again, referring to FIG. 4, stress cracking of the SOG material 10 may be a result of the hydration of the SOG material 10 with H$_2$O 40. The results of the hydration may result in a "crack" 401 in the SOG material where the H$_2$O molecule 40 is incorporated into the SOG material.

Referring briefly to FIG. 3, after the SOG layer 204 is spun on, the SOG layer 204 is annealed in an O$_2$ ambient at approximately 350°-450° C. Although O$_2$ is used in the preferred embodiment, other inert ambients, such as N$_2$ may be used and still remain within the spirit and scope of the present invention. In the preferred embodiment, the device 200 is cooled from the anneal temperature to room temperature in an N$_2$ flow bubbled through a flask of DMDCS and having a flow rate of approximately 5 standard cubic feet per hour (scfh). The partial pressure of the DMDCS may be increased by heating the flask to approximately 50° C.

An altenative method of practicing the present invention is to soak the device 200 subsequent to SOG layer 204 formation but prior to annealing the SOG layer 204. The device 200 with the SOG layer 204 is soaked in HMDS prior to the anneal for approximately for approximately 12-14 hours. After the device 200 is soaked, the SOG layer 204 is annealed in a N$_2$ ambient, at approximately 450° C.

Referring to FIG. 5, three curves are illustrated. The X-axis denotes the etch rate in seconds (S) and the Y-axis denotes the SOG layer thickness in Å. Curve A 50 illustrates the etch rate of a silylated SOG layer without using an O$_2$ plasma. After approximately 12 minutes (700 S), approximately 3000 Å of the original 6000 Å layer remain.

Curve B 60 illustrates the etch rate of a silylated SOG layer after an O$_2$ plasma. After approximately 2 minute of oxygen plasma, the layer has approximately 2500 Å of SOG remaining. The additional time, allows a greater design choice, since the device after application of a SOG layer can be dipped to remove any native oxidation.

Curve C 70 of FIG. 5, illustrates the etch rate of a non-silylated SOG layer after an $O_2$ plasma. After approximately 25 seconds, a 5000 Å thick SOG layer is reduced to essentially zero. This sensitivity to $O_2$ plasma, inhibits the design choices, and requires a change of process to avoid the problem.

Referring to FIGS. 6a–b, a representation of a photomicrograph of a top view of the semiconductor device 100 is shown. The device 100 has been patterned using well-known prior art processes. Conductive regions 102 are formed with oxide region 107 separating the regions. The device 100 is coated with an non-etch back SOG layer, that has been annealed at approximately 400° C. in a $N_2$ ambient. As the device 100 cools from the anneal temperature to room temperature, line cracks 114 are formed. Once the lines cracks 114 are formed, the device performance and yield are diminished, since the line cracks 114 cannot be repaired. Thin layers SOG using a non-etch back process, do not exhibit the line cracks 114 as demonstrated in the thicker layers. It is often necessary to apply more than a single thin layer of SOG to provide sufficient surface planarity. However, after the application of several thin layers of SOG, the film will exhibit the same line cracks 114, if the thickness of the combined layer is large, that is greater than 2000 Å. Additionally, a greater expenditure of time and handling are required for multiple layers of SOG.

Referring to FIGS. 7a–b, a representation of a photomicrograph of the top view of the semiconductor device 200 after the SOG layer of the present invention is applied is shown. Conductive regions 202 are formed with oxide regions 207 separating the regions. The device 200 is coated with an non-etch back SOG layer, that has been annealed at approximately 400° C. in a $N_2$ ambient. As the device 200 cools from the anneal temperature to room temperature, $O_2$ flows through a flask of DMDCS. The silyation of the SOG layer 204 permits the application of a single layer up to thicknesses of 8000 Å, without cracking.

Although the present invention describes a preferred embodiment using specific materials and parameters, such may be varied within the spirit and scope of the present invention. Also, most prior art semiconductor foundations may be utilized and the present invention is not limited to the actual layers specified. One improvement of the invention resides in the improvement of the SOG material aids in the achievement of planarization of the severe topographies present in micrometer and submicrometer geometries. Further, the process may be employed for subsequent intermetal layer formations and is not limited to the method expounded in the preferred embodiment.

Thus, a novel method for chemically modifying SOG for improved device performance by using organosilicon silylation compounds is described.

We claim:

1. A process for silylating spin-on-glass comprising the steps of:
   depositing a first conductive layer on a semiconductor body;
   forming said first conductive layer such that openings are created between patterned sections of said first conductive layer;
   depositing a first dielectric layer on said first conductive layer;
   depositing a glass layer on said first dielectric layer;
   annealing said glass layer in an ambient;
   cooling said semiconductor device in an nitrogen flow bubbled through an organosilicon compound.

2. The process as recited in claim 1, wherein said annealing step is in the range of 350°–450° C.

3. The process as recited in claim 2, wherein said organo-silicon compound is selected from a group consisting of hexamethyldisilazane (HMDS), dimethyldichlorosilane (DMDCS), trimethylchlorosilane (TMCS), dimethyldimethoxysilane (DMDMOS), bis(-dimethylamino)-dimethylsilane (BDADMS) and any other functionally equivalent organosilicon compound.

4. The process as recited in claim 3, wherein said ambient is selected from a group consisting of oxygen and nitrogen.

5. The process as recited in claim 4, wherein said nitrogen flow is approximately 5 standard cubic feet per hour (scfh).

6. The process as recited in claim 5, further including the step of soaking said semiconductor device in HMDS prior to said annealing step.

7. The process as recited in claim 6, wherein said soaking step lasts for 12–14 hours.

8. A process for chemically modifying spin-on-glass for improved performance of a semiconductor device comprising the steps of:
   depositing a first metal layer on said semiconductor body;
   etching said first metal layer such that openings are formed between patterned sections of said first metal layer;
   utilizing a chemical vapor deposition (CVD) technique to deposit a first oxide layer on said first metal layer;
   depositing a spin-on-glass (SOG) layer having a thickness of approximately 3000–8000 Å on said first oxide layer;
   soaking said semiconductor device in hexamethyldisilizane (HMDS) for approximately 12–14 hours;
   annealing said SOG layer at an annealing temperature of approximately 350°–450° C. in an oxygen ambient;
   cooling said semiconductor device from said annealing temperature to room temperature in a nitrogen flow bubbled through a container filled with dimethyldichlorosilane (DMDCS) and heated to a temperature of approximately 50° C.

9. An improved non-etch-back planarization process using a chemically modified spin-on-glass (SOG) comprising the steps of:
   depositing a first metal layer on said semiconductor body;
   forming said first metal layer such that openings are created between patterned sections of said first metal layer;
   utilizing a chemical vapor deposition (CVD) technique to deposit a first oxide layer on said first metal layer;
   depositing a spin-on-glass (SOG) layer having a thickness of approximately 3000–8000 Å on said first oxide layer;
   annealing said SOG layer at an annealing temperature of approximately 350°–450° C. in an oxygen ambient;
   cooling said semiconductor device from said annealing temperature to room temperature in an nitrogen flow bubbled through a container filled with dimethyldichlorosilane (DMDCS) and heated to a temperature of approximately 50° C.

10. The improved non-etch-back planarization process as recited in claim 9, wherein said annealing step in proceed by soaking said semiconductor device in hexamethyldisilizane (HMDS) for approximately 12–14 hours.

* * * * *

UNITED STATES PATENT AND TRADEMARK OFFICE
CERTIFICATE OF CORRECTION

PATENT NO. : 4,885,262

DATED : 12/05/89

INVENTOR(S) : Ting et. al.

It is certified that error in the above-identified patent and that said Letters Patent is hereby corrected as shown below:

| | |
|---|---|
| col. 01, line 41 | delete "line" insert --lines-- |
| col. 06, line 21 | delete "organoslicon" insert --organosilicon-- |
| col 06, line 49 | delete "altenative" insert --alternative-- |
| col. 06, line 65 | delete "minute" insert --minutes-- |

Signed and Sealed this

Fourth Day of December, 1990

*Attest:*

HARRY F. MANBECK, JR.

*Attesting Officer*  *Commissioner of Patents and Trademarks*